United States Patent
Tamai et al.

(10) Patent No.: US 7,204,609 B2
(45) Date of Patent: Apr. 17, 2007

(54) LIGHT-EMITTING DIODE LIGHT SOURCE UNIT

(75) Inventors: Masayuki Tamai, Wakayama (JP); Keiji Morimoto, Wakayama (JP)

(73) Assignee: Noritsu Koki Co., Ltd., Wakayama-ken (JP)

( * ) Notice: Subject to any disclaimer, the term of this patent is extended or adjusted under 35 U.S.C. 154(b) by 104 days.

(21) Appl. No.: 10/789,088

(22) Filed: Feb. 27, 2004

(65) Prior Publication Data

US 2004/0179373 A1    Sep. 16, 2004

(30) Foreign Application Priority Data

Feb. 28, 2003   (JP)   ............... 2003-052634

(51) Int. Cl.
*F21V 7/00* (2006.01)
*H01L 33/00* (2006.01)

(52) U.S. Cl. ............... 362/241; 362/247; 313/498; 313/499; 313/500; 313/505; 257/98; 257/99

(58) Field of Classification Search ............... 362/247, 362/241, 231, 800; 313/500, 505, 498, 499; 257/98, 99
See application file for complete search history.

(56) References Cited

U.S. PATENT DOCUMENTS

| | | | |
|---|---|---|---|
| 5,119,174 A * | 6/1992 | Chen | 257/98 |
| 5,226,723 A * | 7/1993 | Chen | 362/241 |
| 6,459,130 B1 * | 10/2002 | Arndt et al. | 257/432 |
| 6,583,444 B2 * | 6/2003 | Fjelstad | 257/82 |
| 6,874,910 B2 * | 4/2005 | Sugimoto et al. | 362/294 |
| 6,921,183 B2 * | 7/2005 | Yang et al. | 362/241 |
| 2002/0021085 A1 * | 2/2002 | Ng | 313/499 |
| 2002/0047130 A1 * | 4/2002 | Koay et al. | 257/99 |
| 2003/0136968 A1 * | 7/2003 | Fjelstad | 257/82 |
| 2004/0065894 A1 * | 4/2004 | Hashimoto et al. | 257/100 |
| 2004/0120155 A1 * | 6/2004 | Suenaga | 362/362 |

FOREIGN PATENT DOCUMENTS

| | | |
|---|---|---|
| JP | 05/029665 | 2/1993 |
| JP | 06-291939 | 10/1994 |

* cited by examiner

*Primary Examiner*—Sandra O'Shea
*Assistant Examiner*—Jacob Y. Choi (57) ABSTRACT

A light-emitting diode light source unit has a printed circuit board mounting a light-emitting diode (LED) element on its surface. Between the LED element surface-mounted on the printed circuit board and a wiring land formed on the printed circuit board, there is surface-mounted a reflector for directing a beam emitted from the LED element toward an object to be illuminated, and the LED element and the wiring land are connected via a bonding wire.

5 Claims, 11 Drawing Sheets

LIGHT-EMITTING DIODE LIGHT SOURCE UNIT

FIELD OF THE INVENTION

The present invention relates to a light-emitting diode light source unit including a printed circuit board mounting a light-emitting diode element on its surface.

BACKGROUND OF INVENTION

A light-emitting diode light source unit described above is employed as a light source for a facsimile machine, a scanner, etc. This unit has undergone various geometrical optics improvements for obtaining higher illumination intensity available therefrom. For instance, in the case of a light-emitting diode light source known from the Japanese Patent Application "Kokai" No.: Hei. 5-029665 (see paragraphs 0010–0013 and FIG. 2 thereof in particular), on a circuit board, there are arranged, in the form of an array, a plurality of light-emitting diode (LED) elements spaced apart along the length of the board and white resin portions are formed adjacent opposed ends of the array of the LED elements and a transparent resin portion is formed between the opposed white resin portions. Each LED element is die-bonded to a circuit pattern portion of the board, with a top face of the element being wire-bonded to the pattern portion of the board. For forming the white resin portion, there is prepared a semi-liquid material having a high viscosity and a high solidifying speed by mixing a transparent resin material with a white pigment. The two white resin portions are formed by applying this semi-liquid material to the respective positions adjacent the opposed ends of the LED elements array in the form of convex portions progressively raised along the longitudinal direction of the board (i.e. portions having a semi-oval cross section) and then heating the applied material for its solidification. In this, one of the white resin portions is to cover certain portions of the wire bonding and the entire circuit pattern for their protection. A beam emitted from a lateral face of the LED element is reflected by the white resin portion and this reflected beam is then refracted through an interface between the transparent resin portion and ambient air so as to be focused at a position above the LED element.

Another conventional LED light source unit is known from the Japanese Patent Application "Kokai" No.: Hei. 6-291939 (see paragraphs 0029–0030 and FIG. 3 thereof in particular). In this unit, a circuit board mounting thereon a linear array of LED elements is mounted on a resin mount. A portion of this mount extends to the LED mounting surface of the circuit board, with leading ends thereof reaching opposed ends of the LED array, where there are formed inclined faces flared open in a document scanning direction. This inclined face has a surface with a mirror finish, thus forming a reflecting face for the beam emitted from the LED. This beam reflecting face serves for obtaining higher illumination intensity by reflecting the beam emitted from the lateral or front face of the LED element.

In the case of the former-described patent application publication, i.e. the Japanese Patent Application "Kokai" No.: Hei. 5-029665, the white resin portion acting as a "reflector" is formed by applying the material directly to the printed circuit board. Hence, irregularity tends to occur in the spacing relative to each LED element and/or the shape of the reflecting face and such irregularity may invite irregularity in the illumination intensity of the LED array. Further, as this white resin portion is formed as the raised portion for completely covering the portions of the binding wires connecting the LED elements and the circuit pattern, this white resin portion must be formed with great care so as not to damage the bonding wires.

In the case of the latter-described patent application publication, i.e. the Japanese Patent Application "Kokai" No.: Hei. 6-291939, the mount including the reflector is designed to hold and support the entire finished printed circuit board. For this reason, the reflector needs to be disposed away from or keeping clear of e.g. the bonding wires connecting between the LED elements and the circuit pattern portion, requiring a certain distance to be ensured between the LED elements and the reflector. This is disadvantageous for the beam gathering ability of the reflector.

SUMMARY OF THE INVENTION

In view of the above-described state of the art, a primary object of the present invention is to provide a light-emitting diode light source unit which allows the reflector to be as dose as possible to the LED element while avoiding interference with the bonding wire connecting between the LED element and the pattern portion.

For accomplishing the above-noted object, according to the present invention, in a light-emitting diode light source unit having a printed circuit board mounting a light-emitting diode (LED) element on its surface, between the LED element surface-mounted on the printed circuit board and a wiring land formed on the printed circuit board, there is surface-mounted a reflector for directing a beam emitted from the LED element toward an object to be illuminated, and the LED element and the wiring land are connected via a bonding wire.

With the above construction, it is possible to dispose first the reflector at an area between the LED element and the wiring land so that the reflector is located as close as possible to the LED element. Then, the LED element and the wiring land may be connected to each other via the bonding wire. Therefore, one can dispose the reflector as close as possible to the LED element, without regard to the presence of the bonding wire to be subsequently disposed for connecting the LED element with the wiring land.

In case the reflector has a height which is reduced by a certain degree by a certain design requirement, according to one preferred embodiment of the invention, it is proposed to lay the bonding wire to leap over the reflector. On the other hand, in case the reflector has a relatively large height so that the standard bonding wiring technique does not allow the wire to leap over the reflector, according to one preferred embodiment of the invention, it is proposed to form a relay land on a top face of the reflector so that the bonding wire may be laid via this relay land. For instance, at a first step, a first bonding wire portion will be laid between the LED element and the relay land and at a second step, a second bonding wire portion will be laid between the relay land and the wiring land. By selectively implementing an appropriate bonding wire laying technique in accordance with a particular shape of the reflector employed, the reflector can always be disposed as close as possible to the LED element.

In general, the light source unit includes a plurality of LED elements arranged in the form of an array and surface-mounted on the printed circuit board. This requires that the reflector for the LED array be formed as a narrow elongate member having a length corresponding to that of the LED array. For this reason, to allow the surface-mounting operation to proceed in a smooth manner, it becomes necessary to increase the rigidity of this elongate reflector. In order to solve this problem, according to a preferred embodiment of the invention, the light source unit further comprises a frame member connected with and supporting the reflector, and this frame member together with the reflector connected thereto is surface-mounted on the printed circuit board. And, the wiring land is laid at an area between the reflector and the frame member. This forming of the reflector as such frame-reinforced rigid unit helps allow the reflector to provide a uniform and stable reflecting face configuration without irregularities in the direction of the length of the LED array.

Further and other features and advantages of the present invention will become apparent upon reading the following detailed description of preferred embodiments thereof with reference to the accompanying drawings.

DETAILED DESCRIPTION OF THE PREFERRED EMBODIMENT

Figure 1:
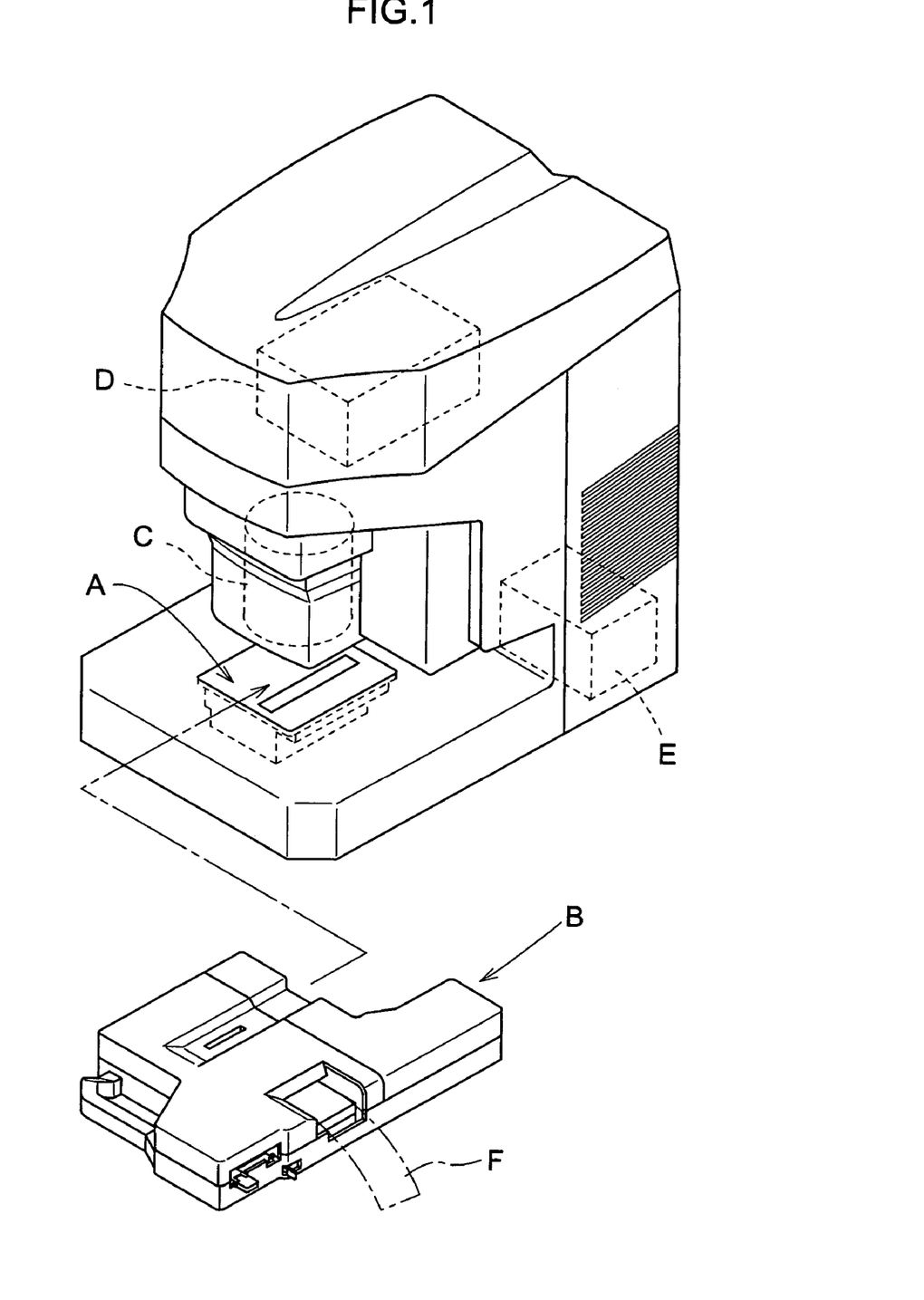
FIG. 1 shows an appearance of a film scanner using a light-emitting diode light source unit of the present invention.
Figure 2:
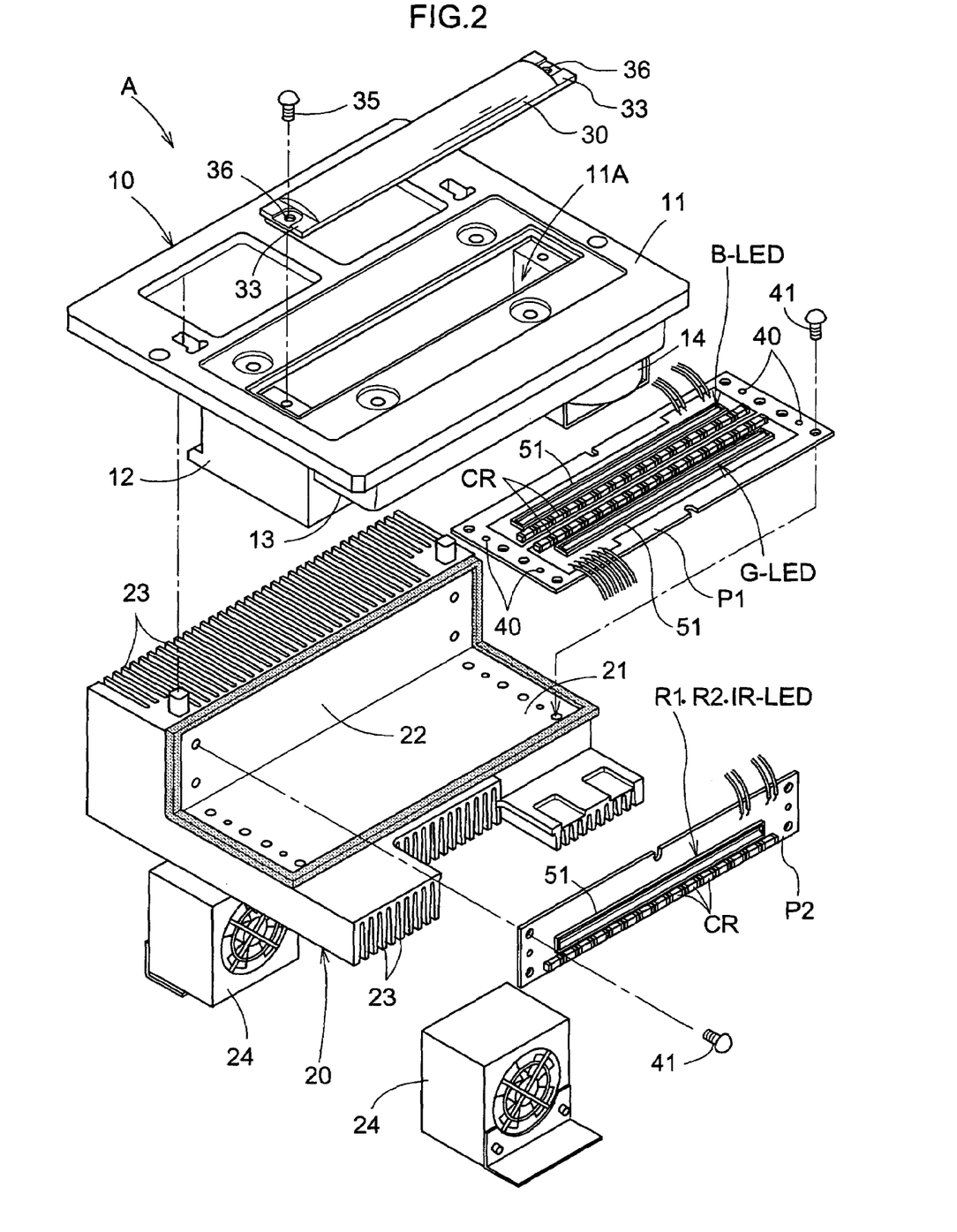
FIG. 2 is an exploded view of the film scanner shown in FIG. 1.

FIG. 1 shows an appearance of a film scanner using a light-emitting diode (LED) light source unit according to the present invention and FIG. 2 is an exploded view of this film scanner. The film scanner includes a light source unit A, a film carrier unit B, a lens unit C, a photoelectric converter unit D, and a control unit E. In operation, a beam from the light source unit A is irradiated on a developed photographic film F carried on the film carrier B and the transmission beam past this photographic film F is guided by the lens unit C to the photoelectric converter unit D. In this unit D, a CCD (Charge Coupled Device) type line sensor incorporated therein obtains, from an image in the photographic film F, image data in the form of digital signals corresponding to the three primary colors of R (red), G (green) and B (blue) and obtains also, by means of an infrared beam (IR), its beam intensity variable due to presence of a defect or flaw or dust or the like in the photographic film F as image data in the form of digital signals for use in flaw correction.

The light source unit A includes a plurality of light-emitting diode (LED) arrays (generically representing a green LED array G-LED, a blue LED array B-LED, and a red/infrared LED array R1·R2·IR-LED to be detailed later) each comprising an array of a plurality of LED elements 9 arranged along a main scanning direction for generating the beams of the three primary color components and the infrared beam. The film carrier unit B is designed for transporting the film F back and forth along a sub scanning direction. And, a plurality of film carrier units B are prepared to cope with a plurality of types of photographic films F such as 135 size, 240 size, 120/220 size films, so that these carriers are exchangeable. The lens unit C includes a zooming type optical lens which is operable to cause an image in the photographic film F carried by the film carrier B to be impinged in focus on the CCD type line sensor incorporated in the photoelectric converter unit D, the lens allowing variation of a magnifying power depending on the desired number of pixels to be obtained. The photoelectric converter unit D includes a three-line type CCD line sensor corresponding to the three primary colors of R (red), G (green) and B (blue) and a one-line type CCD line sensor having sensitivity for the infrared beam (IR).

Figure 3:
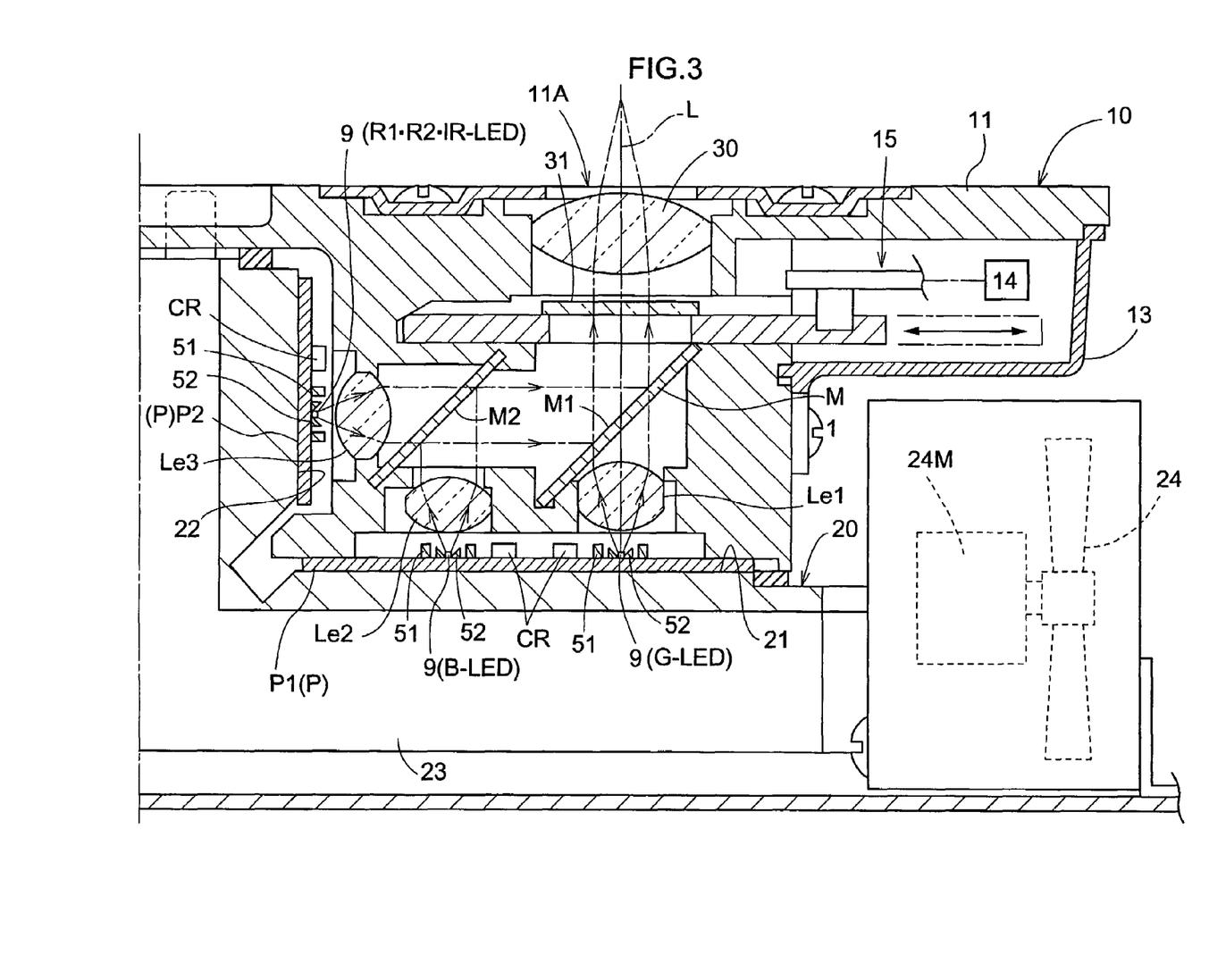
FIG. 3 is a section view of the film scanner shown in FIG. 1.

As shown in FIGS. 2 and 3, the light source unit A includes an upper case 10 formed as resin molded component and a lower case 20 formed of an aluminum alloy. The upper case 10 includes a flat upper table portion 11 and a box portion 12 formed integrally therewith and projecting from a bottom face of the upper table portion 11. Further, a resin cover 13 is provided for the bottom face of the upper table portion 11. The lower case 20 includes a bottom wall portion 21, a lateral wall portion 22 formed integrally therewith and a plurality of fins 23 as heat discharging elements formed integrally with respective outer faces of the bottom wall portion 21 and the lateral wall portion 22. This light source unit A further includes a pair of fans 24 for feeding cooling air to the fins 23.

The upper table portion 11 of the upper case 10 defines an opening 11A of a predetermined width formed along the main scanning direction for irradiating beam upwards. Within this opening 11A, there is provided a cylindrical condensing lens 30 and at a position below this condensing lens 30, there is provided an ND filter 31 movable into and out of the optical axis of the lens 30. More particularly, this ND filter 31 is mounted to be slidable between a condition (position) where the filter is located downwardly of the condensing lens 30 and a further condition where the filter is retracted inside the cover 13. For realizing this movement, the filter 31 is operably connected with a crank mechanism 15 activated by a drive from an electromagnetic solenoid type actuator 14 in the cover 13. In operation, when this ND filter 31 is located at the position below the main condensing lens 30 for adjusting the CCD of the photoelectric converter unit D, the filter 31 reduces the amount of beam from the light source unit A, thus appropriately adjusting the photoelectric converter unit D with an appropriate amount of beam.

Further, the box portion 12 accommodates therein a first mirror M1 of dichroic type disposed at a lower position on an extension of the optical axis L of the condensing lens 30, a first lens Le1 of cylindrical type, a second mirror M2 of dichroic type disposed beside the first mirror M1, a second lens Le2 of cylindrical type for guiding beam to a reflecting side of the second mirror M2 and a third lens Le3 of cylindrical type for guiding the beam to a transmitting side of the second mirror M2.

To the bottom wall portion 21 of the lower case 20, there is mounted a first printed circuit board P1 mounting thereon a light-emitting diode array G-LED consisting of a plurality of chip-type green LED elements 9 linearly arranged along the main scanning direction and a light-emitting diode array B-LED consisting of a plurality of chip-type blue LED elements 9 linearly arranged along the main scanning direction. To the lateral wall portion 22 of the lower case 20, there is mounted a second printed board P2 mounting thereon a light-emitting diode array R1·R2·IR-LED including first red, second red and infrared beam LED elements 9 linearly arranged in the mentioned order along the main scanning direction. Then by assembling the lower case 20 with the upper case 10 by superposing the latter on the former, the green LED array G-LED is disposed at the focal position of the first lens Le1, the blue LED array B-LED is disposed at the focal position of the second lens Le2 and the first red, second red and infrared LED array R1·R2·IR-LED is disposed at the focal position of the third lens Le3, respectively.

The green LED elements 9 have a wavelength of 400–480 nm, the blue LED elements 9 have a wavelength of 520–560 nm, and the first red LED elements 9 and the second red LED elements 9 have a combined wavelength of 620–750 nm, and the infrared LED elements 9 have a wavelength of 830–950 nm, respectively. The first mirror M1 transmits the beam of the particular wavelength (400–480 nm) from the green LED elements 9 while reflecting beams of any other wavelength. The second mirror M2 transmits the beams of the particular wavelengths (620–750 nm and 830–950 nm) from the first red, second red and infrared LED elements 9 while reflecting the beam from the blue LED elements 9 (520–560 nm).

With the above-described construction, the beams from the green LED array GLED are rendered into parallel rays through the first lens Le1 and then transmitted through the first mirror. M1 to be guided to the condensing lens 30. The beams from the blue LED array B-LED are rendered into parallel rays through the second lens Le2 and reflected first by this second mirror M2 and then reflected by the first mirror M1 to be guided to the condensing lens 30. The beams from the first red, second red and infrared LED array R1·R2·IR-LED are rendered into parallel rays through the third lens Le3 and transmitted through the second mirror M2 and then reflected by the first mirror M1 to be guided to the condensing lens 30. By the function of the condensing lens 30, these rays are condensed at a desired scanning area of the photographic film F carried by the film carrier unit B.

Figure 4:
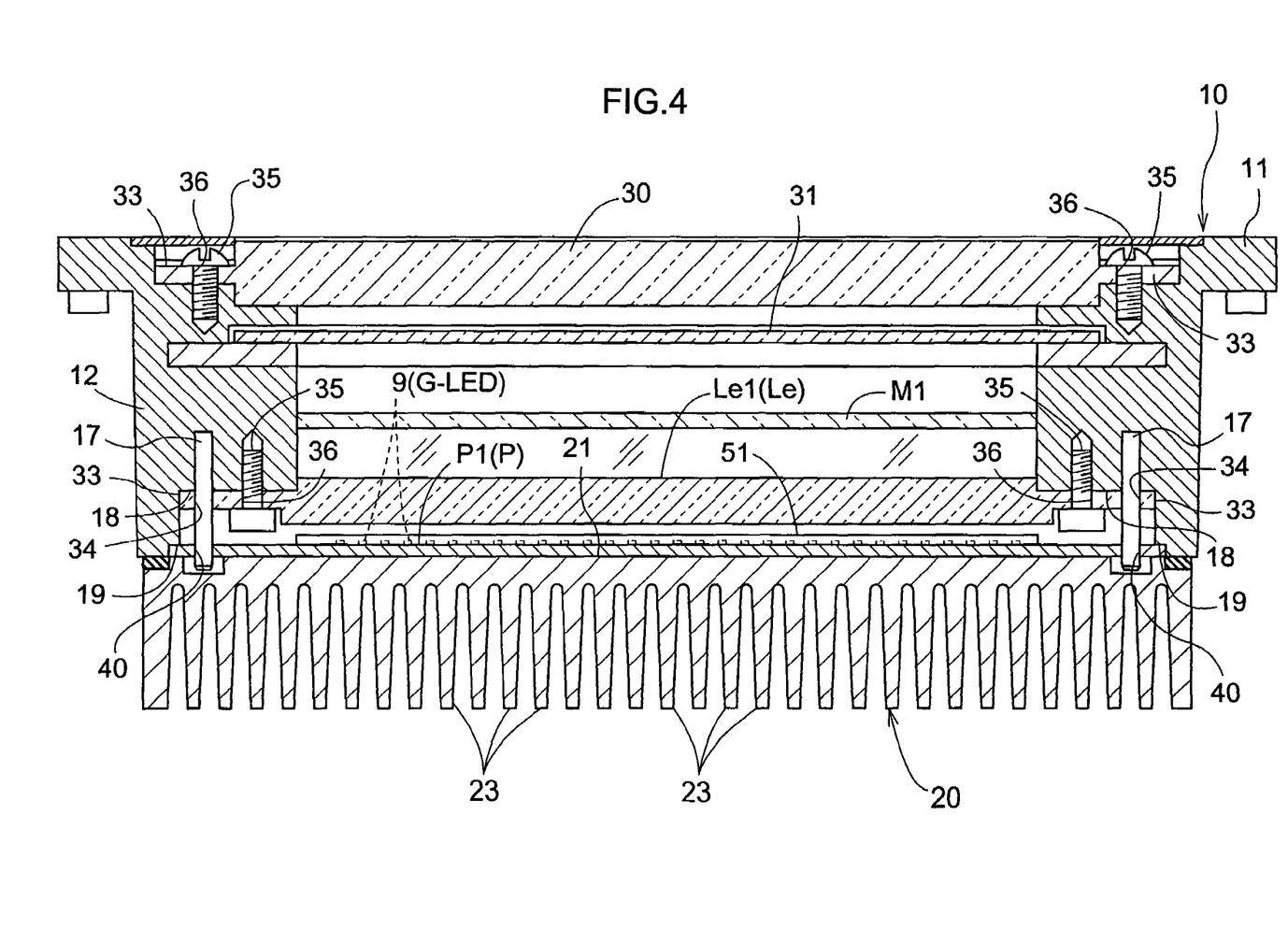
FIG. 4 is an exploded cross section of the light source unit.

As may be apparent from FIG. 4, in order to fixedly determine the focal position of the lens Le (referring generically to the three kinds of lenses described above) corresponding to the LED array LED (generically referring to the three kinds of LED arrays described above) mounted on the printed circuit board P (generically referring to the first printed circuit board P1 and the second printed circuit board P2 described above), positioning pins 17 are provided erect from the box portion 12 of the upper case 10 and positioning faces 18 are formed for coming into contact with the lens Le. Further, at portions of the box portion 12 facing the bottom wall portion 21 and the lateral wall portion 22, there are formed reference faces 19 for coming into contact with the printed circuit board P. At opposed ends of each lens Le (i.e. the first lens Le1, second lens Le2 or third lens Le3), there are integrally formed support pieces 33 for coming into contact with the positioning faces 18, pin holes 34 for engagement with the pins 17 and screw holes 36 through which fixing screws 35 are to be inserted. With the sole difference of not using the positioning pins 17, the construction for supporting the condensing lens 30 to the upper case 10 is identical to that for supporting the lenses Le to the box portion 12. Namely, the screws 35 will be inserted through the screw holes 36 formed in the support pieces 33 formed at the opposed ends of the condensing lens 30 and then the inserted screws 35 will be fixedly threaded with the upper case 10.

The first printed circuit board P1 too defines pin holes 40 for engagement with the positioning pins 17. This first printed circuit board P1 will be fixed to the bottom wall portion 21 by means of screws 41 and the second printed circuit board P2 will be fixed in position to the lateral wall portion 22 by means of the screws 41 (see FIG. 2). Incidentally, in mounting the first and second printed circuit boards P1, P2 to the bottom wall portion 21 and the lateral wall portion 22 respectively, silicon grease is applied to the interfaces thereof for improvement of heat conductivity.

With the above-described construction, when the first, second and third lenses Le1, Le2, Le3 are to be supported to the box portion 12, the pins 17 will be inserted into the pin holes 34 defined in the support pieces 33 formed at the opposed ends of each lens and then under this condition, the screws 35 inserted through the screw holes 36 will be fastened. In this manner, each lens Le1, Le2, Le3 can be supported to the box portion 12 with accuracy. Thereafter, the upper case 10 and the lower case 20 will be connected with each other with superposing the former on the latter. With this, the positioning pins 17 formed on the bottom face of the box portion 12 will engage into the corresponding pin holes 40 of the first printed circuit board P1 supported to the bottom wall portion 21, thereby to fixedly determine the position relative to the first printed circuit board P1 and fixedly determine also the position of the lower case 20 relative to the upper case 10 at the same time. As a result, the position of the third lens Le3 relative to the second printed circuit board P2 too will be fixedly determined as well.

The printed circuit board P uses a relatively thick aluminum substrate 45 as a material having a high heat conductivity. On this printed circuit board P, as described hereinbefore, there are mounted the array of the chip type LED elements 9 along the main scanning direction. Further, on the surface of the printed circuit board P, there are also mounted a series of chip resistors CR along the extending direction of the array of the LED elements 9. These chip resistors CR all have a same resistance value and a same size. Heat generated when electric power is supplied to the chip resistors CR is conducted to the printed circuit board P and consequently to the LED elements 9, thereby to realize uniform temperature distribution among the plurality of LED elements 9.

Figure 5:
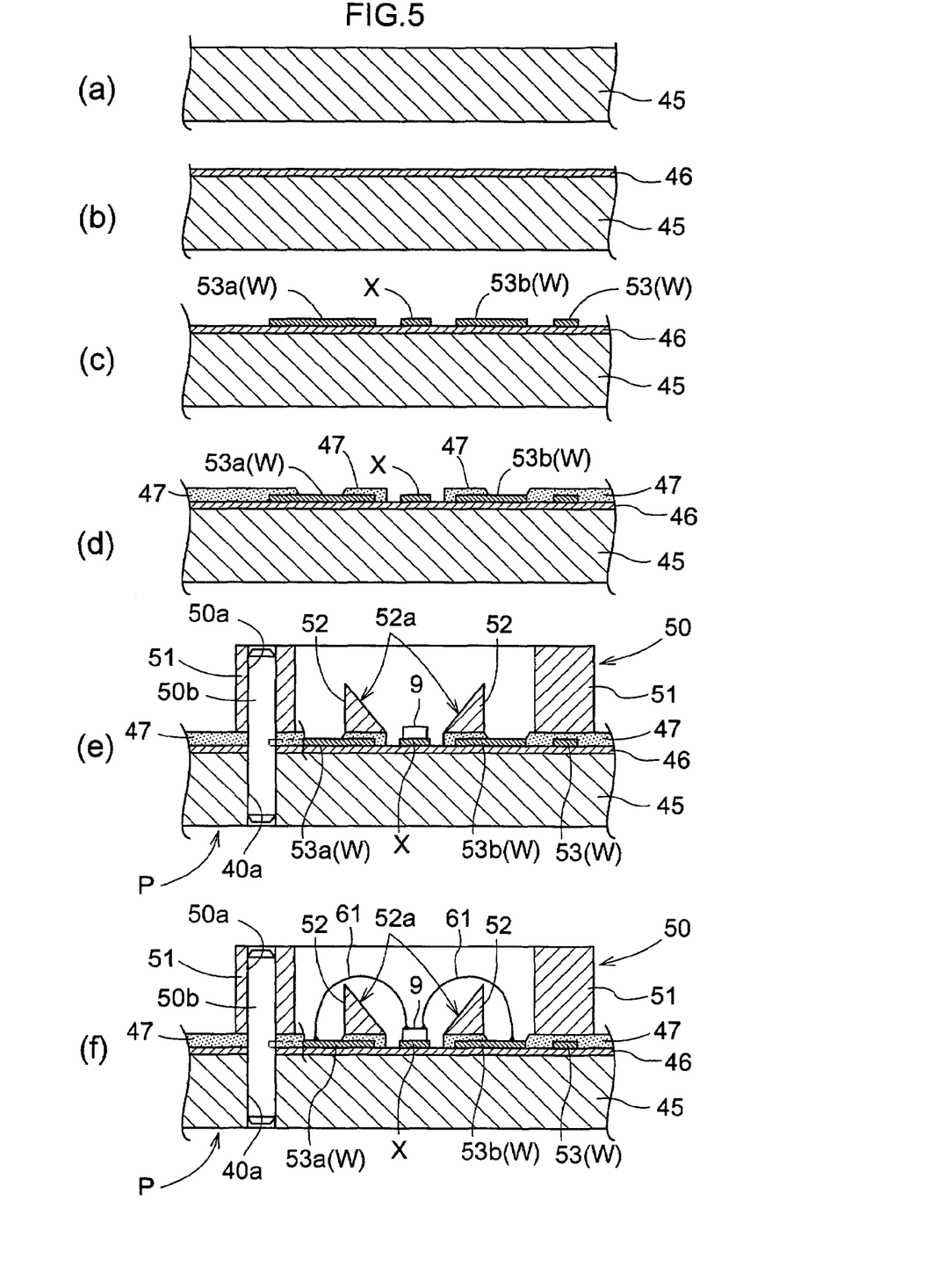
FIG. 5 is a schematic illustrating a process of fabricating the light-emitting diode light source unit of the present invention.
Figure 6:
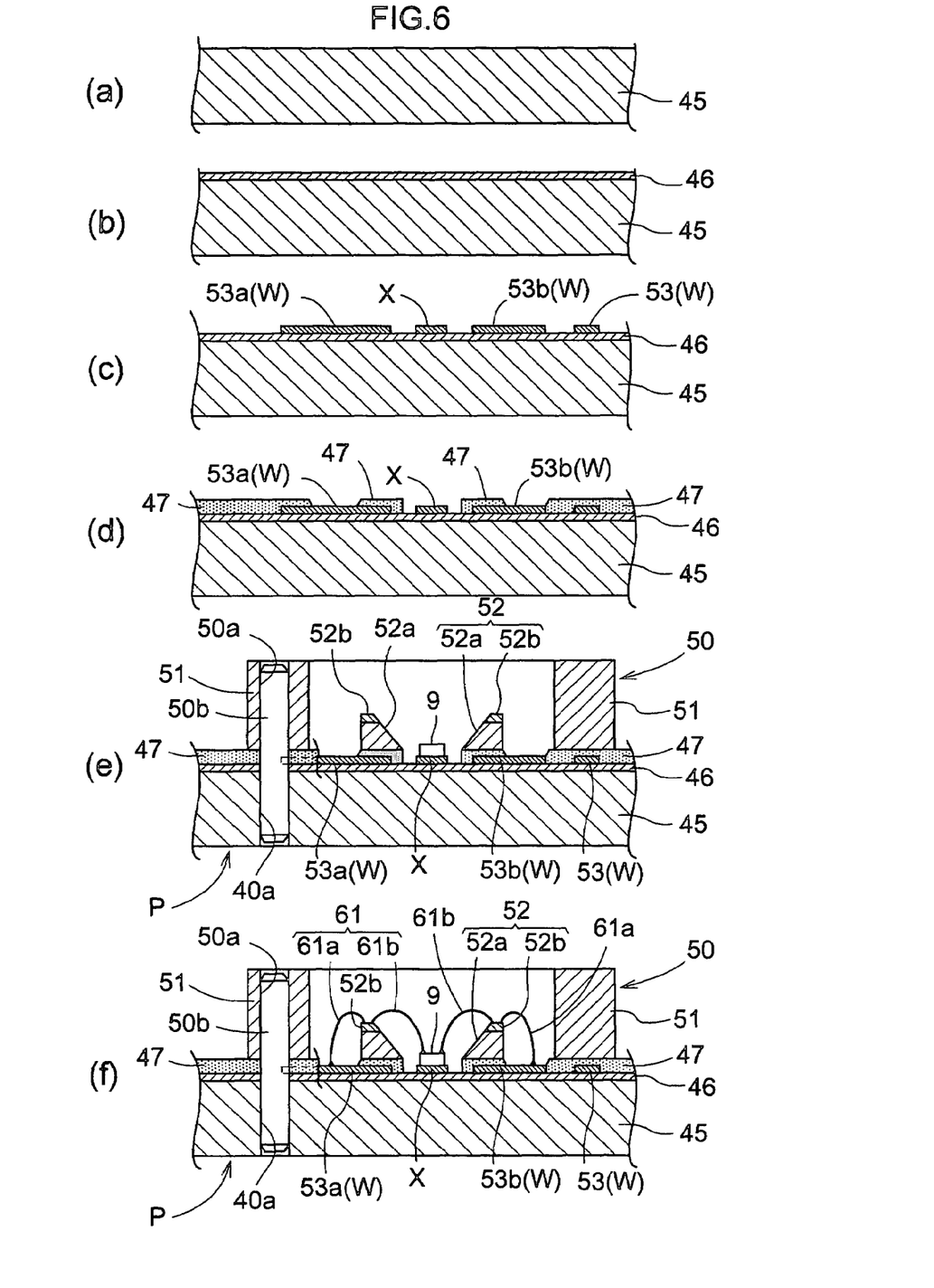
FIG. 6 is a schematic illustrating another process of fabricating the light-emitting diode light source unit of the present invention.

Next, the construction of the printed circuit board P will be described in greater details with reference to FIG. 5 and FIG. 6. FIG. 5 illustrates a manufacturing process of the printed circuit board P and FIG. 6 illustrates a process of surface-mounting parts thereon. These processes are only illustrative, not limitative for the present invention.

The surface of the substrate 45 which is formed of aluminum as described above is coated with a ceramic material for forming an insulating ceramic layer 46 (FIG. 5(*a*) and FIG. 5(*b*)). On the top face thereof, a printed circuit wiring (wiring land) W formed of a copper foil or a gold foil, etc. and a surface-mounting pad X are formed. (FIG. 5(*c*)). Further, on the top surface of this printed circuit board P, a resist film 47 made of an insulating resin is formed (FIG. 5(*d*)).

Then, to this printed circuit board P thus fabricated, there will be surface-mounted the LED elements 9 and a reflector unit 50 including a rectangular frame member 51 and reflectors 52 assembled integrally with each other. Incidentally, in this embodiment, a pin-hole positioning arrangement similar to the one described above is employed also for mounting the reflector unit 50 to the printed circuit board P. To this end, a pair of reflector-side reference holes 50a are formed at two positions in the frame member 51 of the reflector unit 50 and a pair of board-side reference holes 40a are formed at corresponding positions in the printed circuit board P. Then, by inserting positioning pins 50b through these holes 50a and 40a together, the reflector unit 50 can be mounted at a predetermined position of the printed circuit board P in a reliable manner (FIG. 5(e)). Needless to say, instead of such mechanical pin-hole positioning (registry) arrangement, the mounting and positioning operation of the reflector unit 50 to the printed circuit board P can be effected by means of other type of arrangement (e.g. optical) using the board-side reference hole 40a of the printed circuit board P and the reflector-side reference holes 50a of the reflector unit 50. Further alternatively, the unit 50 and the board P can be mounted together and fixed in position relative to each other by utilizing the pin holes 40 of the former and the reflector-side reference holes 50a of the latter.

For laying the bonding wire 61 between each LED element 9 and the wiring land W, two methods are proposed. According to one method, the bonding wire 61 is laid between the LED element 9 and the wiring land W, with the wire 61 leaping over the reflector 52 (FIG. 5(f)). According to the other method, a flat face is formed on the top of the reflector 52 used in this embodiment. And, on this flat face, a relay land 52b is formed. Then, a first bonding wire portion 61a is laid between the LED element 9 and the relay land 52b and then a second bonding wire portion 61b is laid between the relay land 52b and the wiring land W (FIG. 6(f)). The steps shown in FIGS. 6(a) through 6 (e) are same as those shown in FIGS. 5(a) through 5 (e). Therefore, these steps will not be described here. With either method above, formation of the connection between the LED element 9 and the wiring land W via the bonding wire 61 or the bonding wire portions 61a, 61b completes the basic construction of the light emitting diode light source unit.

Figure 7:
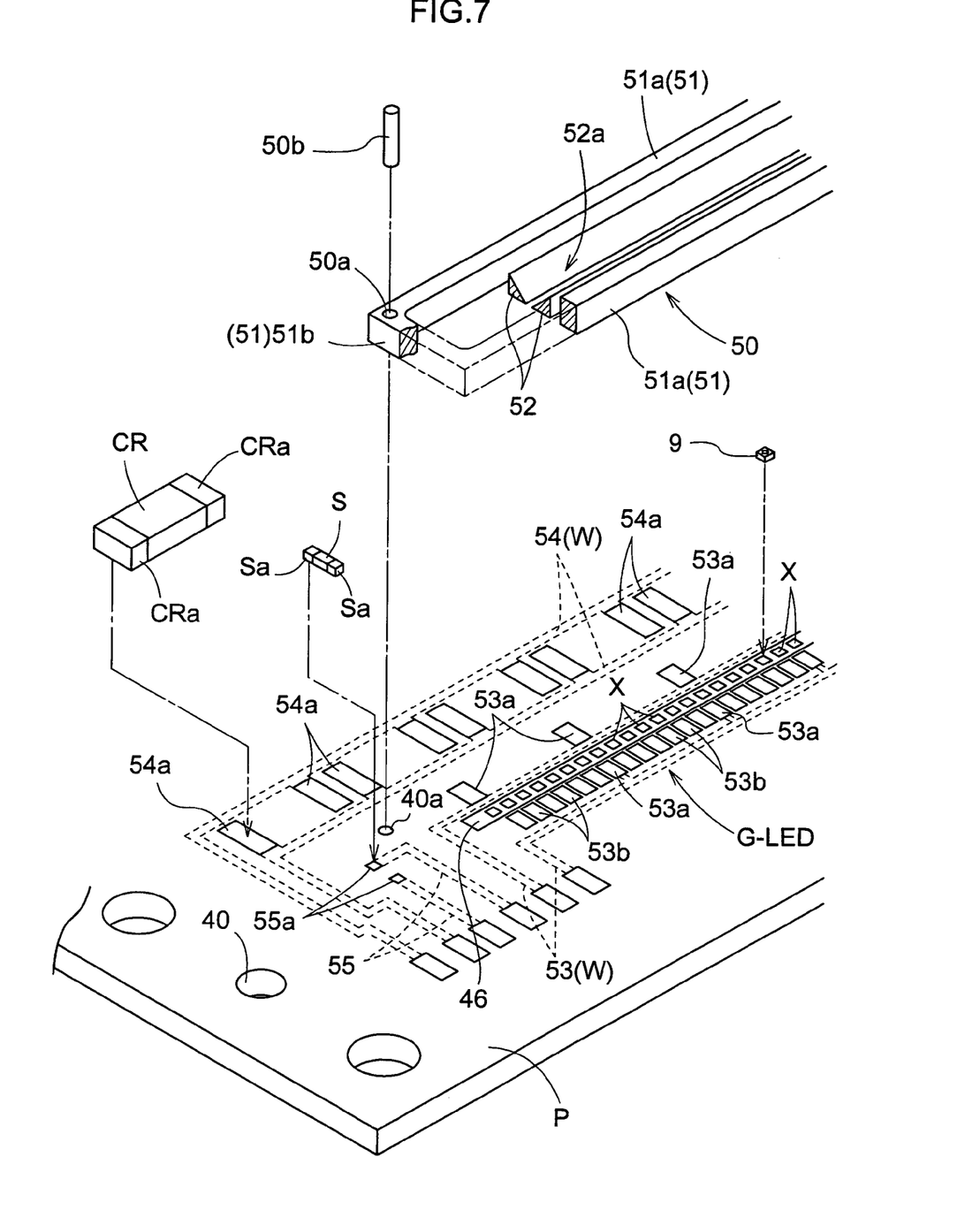
FIG. 7 shows an appearance of the unit before LED elements, a reflector unit etc. are mounted on a printed circuit board.
Figure 8:
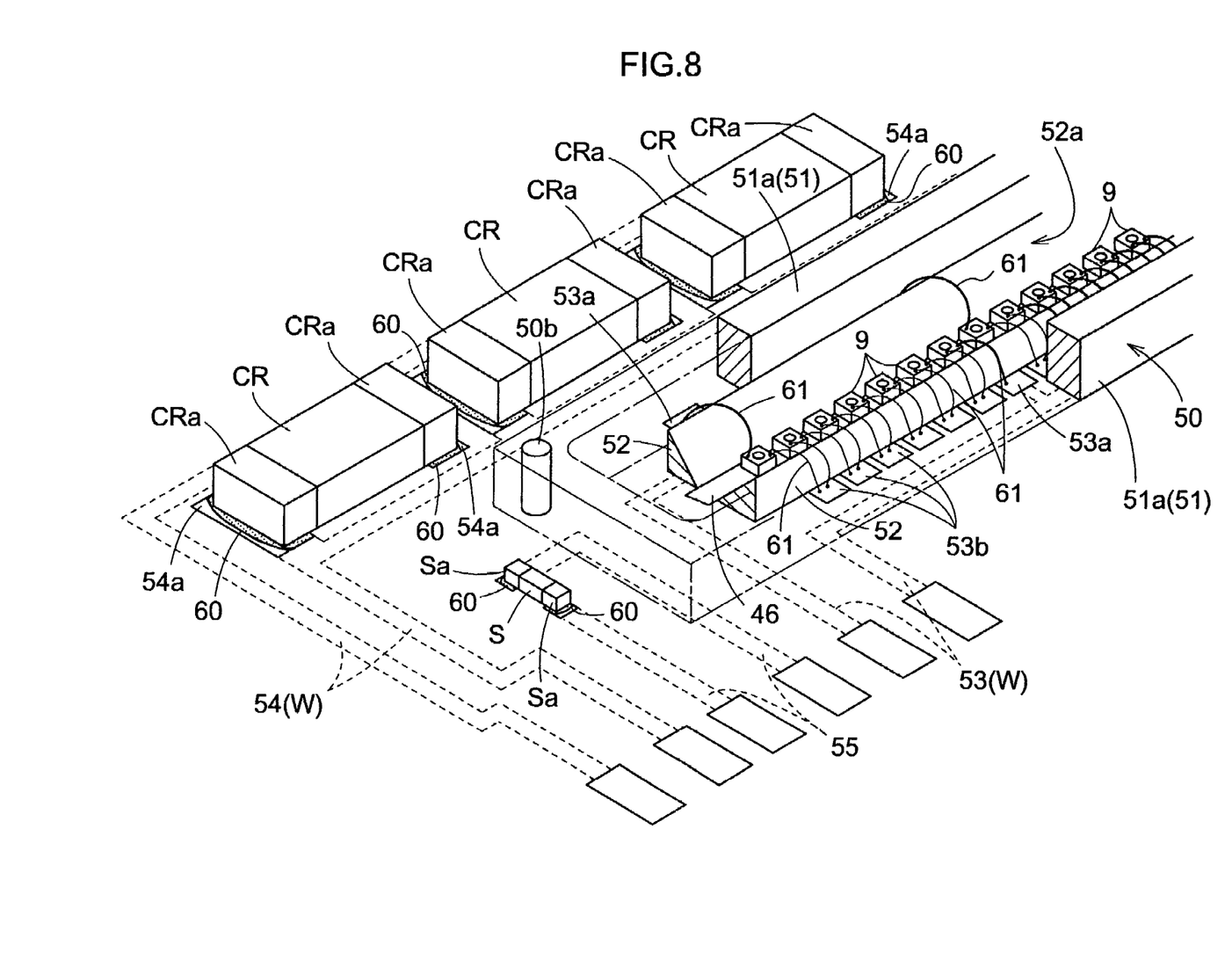
FIG. 8 shows an appearance of the unit after the LED elements, the reflector unit etc. are mounted on a printed circuit board.
Figure 9:
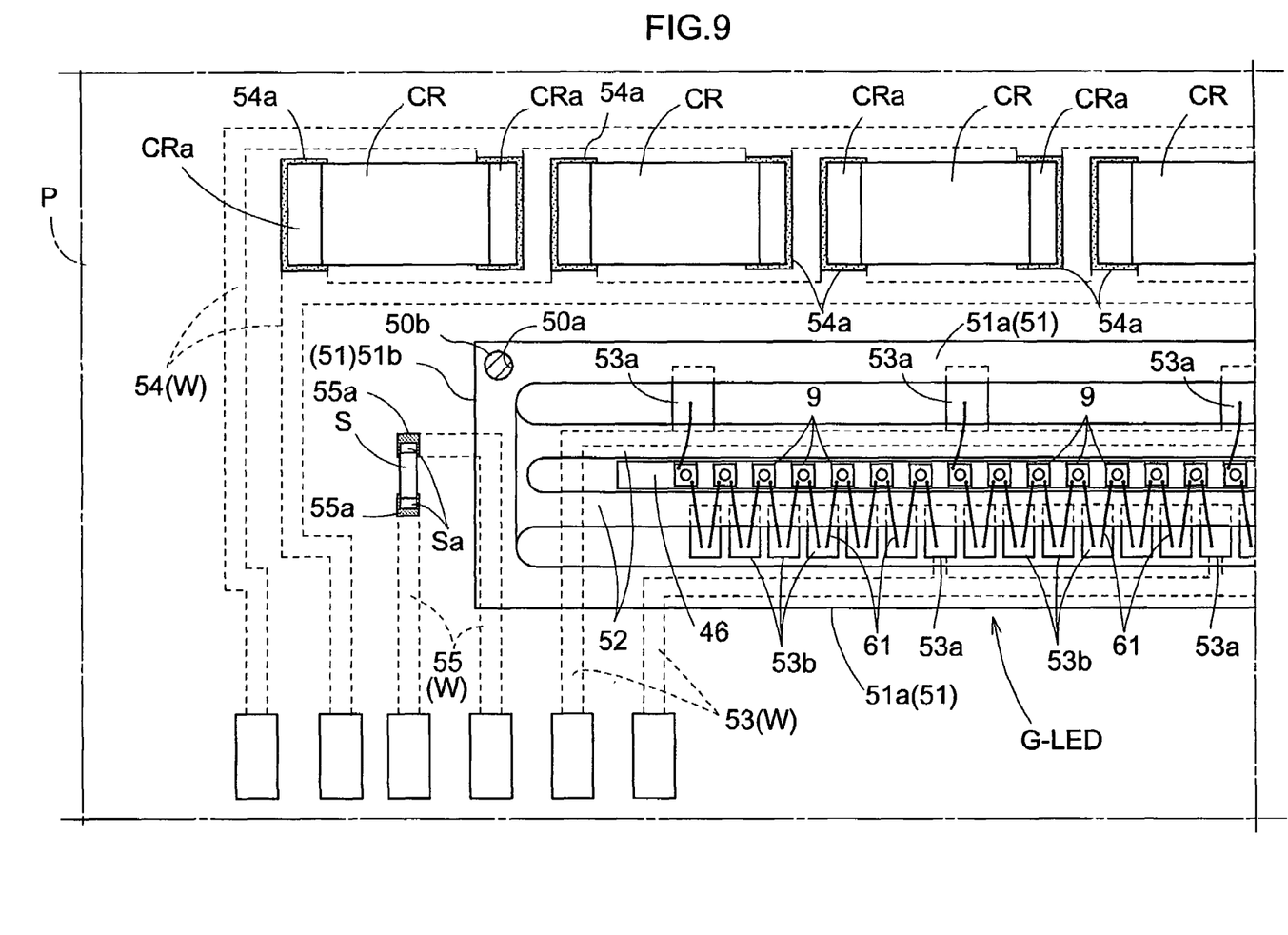
FIG. 9 is a top plan view showing the appearance of the unit after the LED elements, the reflector unit, etc. are mounted on the printed circuit board.

FIG. 7 shows an appearance before the LED elements 9, the reflector unit 50 and others are surface-mounted on the printed circuit board P, FIG. 8 shows an appearance after the surface-mounting and FIG. 9 is a plan view showing the appearance after the surface-mounting. As may be clearly seen from FIG. 7 in particular, around the surface-mounting pad X for the LED elements 9, there is formed the resist layer 47 leaving a blank area greater than the area of the surface-mounting pad X so as to expose the ceramic layer 46. This ceramic layer 46 is formed by coating a ceramic material on the aluminum substrate 45 and has a much higher reflecting power than e.g. the resist layer 47. For this reason, this ceramic layer 46 exposed outside the surface-mounting pad X functions as a back reflecting face for the beam emitted from the LED element 9 and contributes to increase of illumination intensity to the illuminated object (in this case, the photographic film F) by the LED array LED, in cooperation with reflecting faces 52a of the reflector unit 50 to be described later. For further enhancement of this effect, it is desired to select a ceramic material having superior reflecting property, as the insulating material to be coated on the surface of the metal substrate 45 or to select an appropriate coating method which provides a maximum mirror-like surface. Incidentally, instead of aluminum, the substrate 45 can be formed also of a copper plate or metal alloy or of a resin material.

Figure 10:
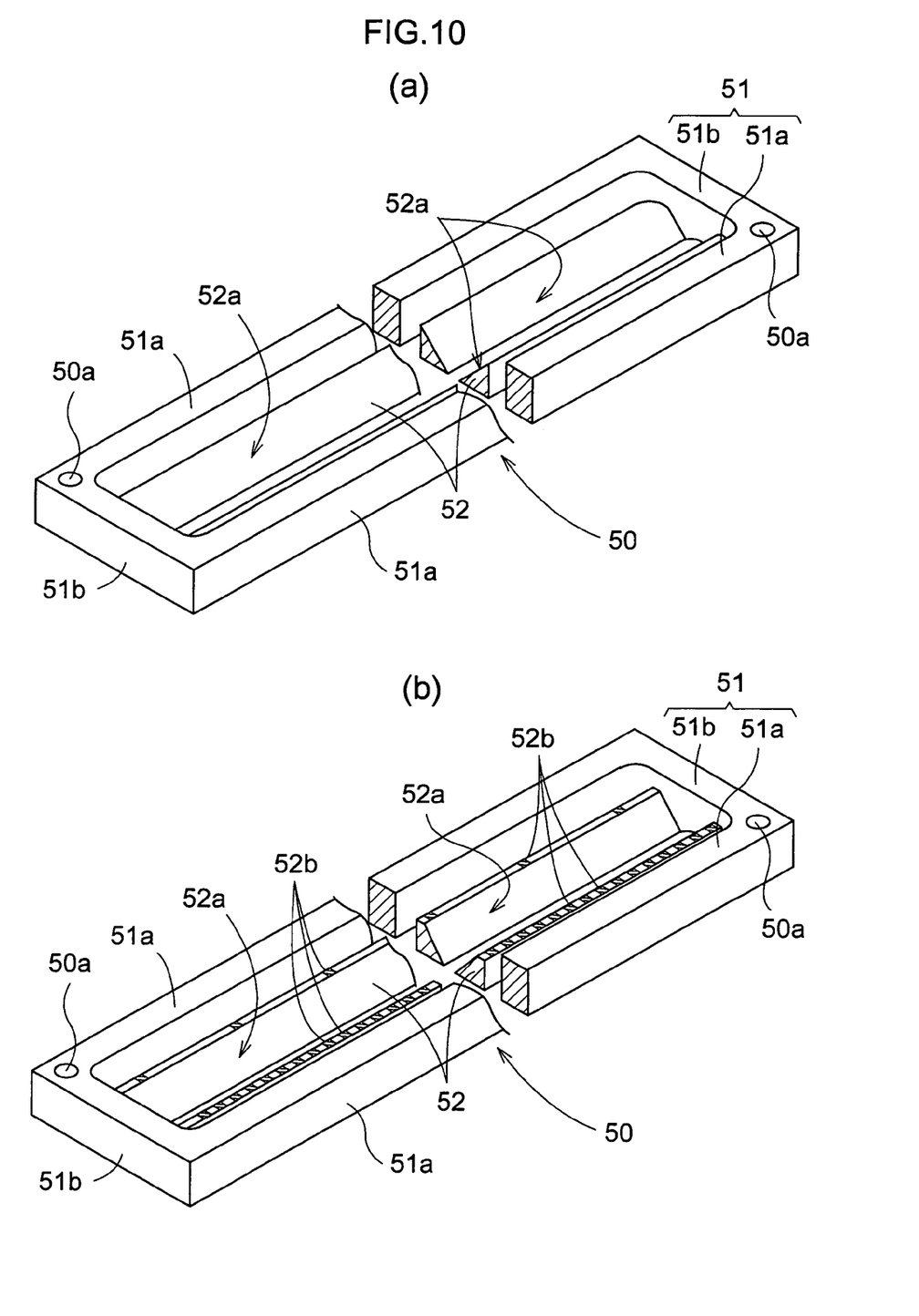
FIG. 10 is a perspective view of the reflector unit.

The reflector unit 50 shown in FIG. 10(a) is formed of a liquid crystalline polymer and consists essentially of a rectangular frame member 51 having an opposed pair of long-side portions 51a and an opposed pair of short-side portions 51b and two elongate reflectors 52. Each reflector 52 has a substantially right-triangular cross section and a length sufficient to substantially cover the entire length 9 main scanning direction length) of the LED array. Opposed terminal ends of this reflector 52 are joined to the opposed short-side portion 51b of the rectangular frame member 51 surrounding the circumference of the reflectors 52. Both the long-side portions 51a and the short-side portions 51b have a larger cross section than that of the reflector 42 and formed and joined together in the form of rectangle. Accordingly, these portions have high rigidity and can support the reflectors 52 in a reliable manner. Each reflector 52 includes the inclined reflecting face 52a which is to be located to face the LED elements 9 which the reflector 52 is surface-mounted on the board. This inclined reflecting face 52a reflects the beam from the LED elements 9 toward the object to be illuminated. FIG. 10(b) shows a modification of the reflector unit 50. This unit differs from the reflector unit 50 shown in FIG. 10(a) in that the flat face is formed on the top of the reflector 52 and the above-described relay land 52b made of a conducting material such as copper is formed on this flat face.

Figure 11:
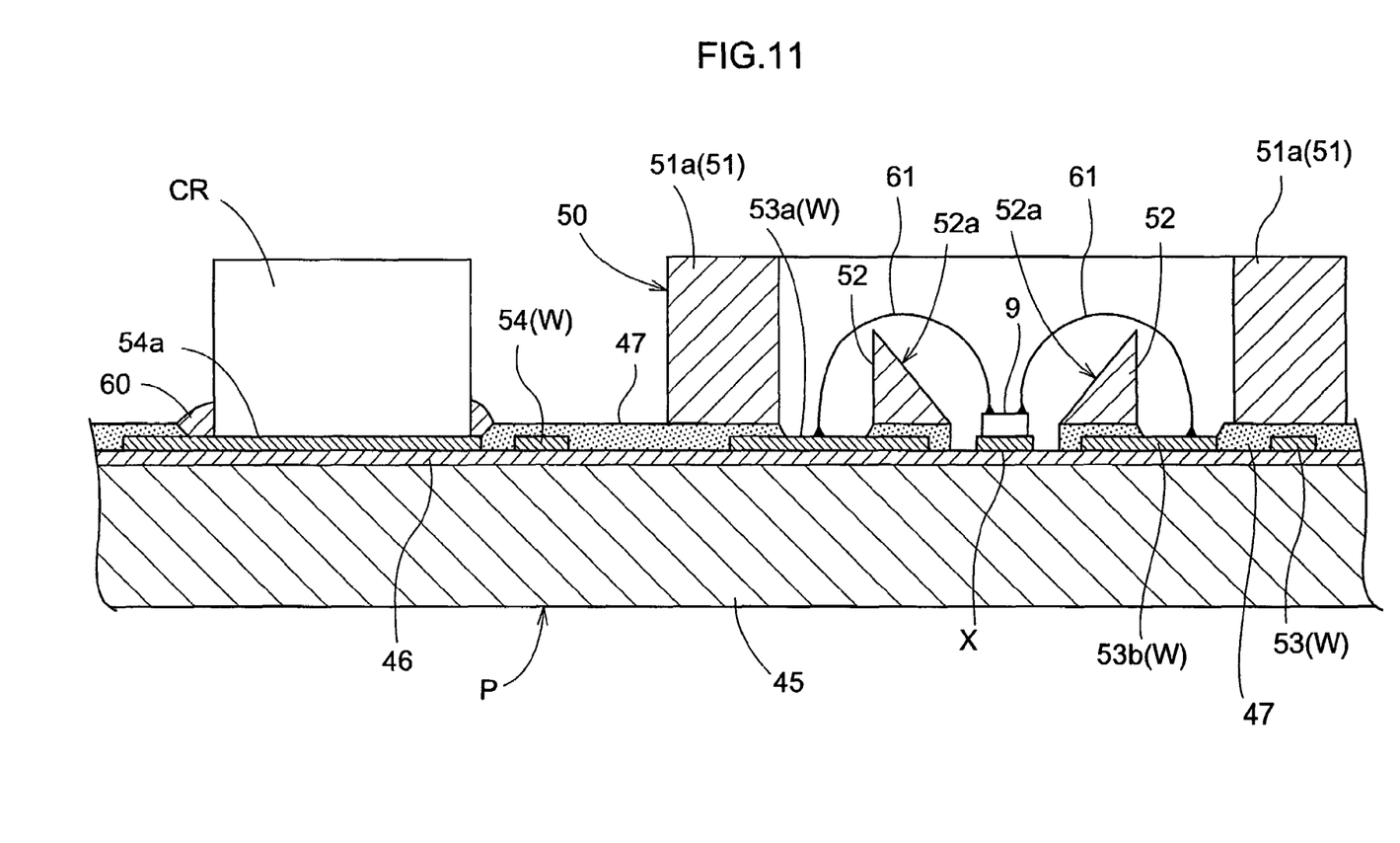
FIG. 11 is a section of an area of the printed circuit board where the LED elements are surface-mounted.

As can be seen from FIG. 11 which is a section of the area of the printed circuit board P surface-mounting the LED elements 9, the bonding wire 61 extending and connecting between the LED element 9 and the printed circuit wiring (wiring land) W is laid in such a manner that the wire 61 leaps over the reflector 52. And, the wiring land W is laid at an area or gap formed between the reflector 52 and the frame member 51 of the mounted reflector unit 50. Incidentally, in this particular embodiment, the reflector 52 has a height of about 1 mm and the gap between the reflector 52 and the LED element 9 has a width of about 0.5 mm.

As may be clearly seen from FIG. 8 and FIG. 9, the printed circuit wiring (wiring land) W includes a light-emitting wiring portion 53 for supplying power to the LED elements 9, a heating wiring portion 54 for supplying power to the chip resistors CR and a metering wiring portion 55 for applying a potential to a chip thermistor S acting as a temperature metering means. The LED array LED includes a plurality of units of LED elements 9, each unit consisting of seven LED elements 9 electrically serially connected to each other. The light emitting wiring portion 53 includes power terminals 53a each supplying power to one unit (group) of LED elements 9, and relay terminals 53b formed independently thereof along the array direction of the LED elements 9. The heating wiring portion 54 includes terminals 54a to be connected by solder 60 with opposed electrodes CRa of the chip resistors CR. Further, the metering wiring portion 55 includes terminals 55a which are connected by solder 60 with opposed electrodes Sa of the thermistor S.

In addition to the foregoing embodiment, the light-emitting diode light source unit according to the present invention can be used also as a light source for use in an electrostatic copier, a flat bed scanner, etc.

The present invention may be embodied in any other manner than described above. Various modifications thereof will be apparent for those skilled in the art without departing from the essential concept thereof defined in the appended claims.

The invention claimed is:

1. A light source unit comprising:
   a printed circuit board;
   a wiring land formed on said printed circuit board;
   a light-emitting diode (LED) element surface-mounted on said printed circuit board;
   a bonding wire connecting between said LED element and said wiring land; and
   a reflector unit comprising a rigid frame member and a reflector, said reflector unit being surface mounted on said printed circuit board to surround said LED element and being fabricated independently of said printed circuit board to improve rigidity of said frame member;
   wherein said reflector unit being formed integrally with said frame member so that said reflector unit can be arranged relative to said LED element with accuracy and without change over time to provide a uniform and stable reflecting face configuration;
   wherein said reflector is connected to an inner side of said frame member and supported by said frame member, said reflector being arranged between said LED element and said wiring land for directing a beam emitted from said LED element toward an object to be illuminated,
   wherein said frame member comprises a rectangular frame member having long-side portions and short-side portions,
   wherein said reflector is arranged along said long-side portions and rigidly formed in unison with said frame member,
   wherein said LED elements are arranged to form an LED array, and
   wherein said reflector has a reflecting surface extending along said LED array.

2. The light source unit of claim 1, wherein said wiring land is laid at an area between said reflector and said frame member.

3. The light source unit of claim 1, wherein said bonding wire is laid to leap over said reflector.

4. The light source unit of claim 1, wherein said flector comprises a relay land formed on a top face thereof and said bonding wire is laid via said relay land.

5. The light source unit of claim 1, wherein the light source unit is for use in a color film scanner and comprises a plurality of said LED arrays for red, blue and green colors.

* * * * *